United States Patent [19]

Stegmüller et al.

[11] Patent Number: 4,950,979

[45] Date of Patent: Aug. 21, 1990

[54] INSULATING MEMBER, FUNCTIONING AS A VOLTAGE DIVIDER IN A HIGH VOLTAGE SYSTEM

[75] Inventors: Karl Stegmüller, Wiesent; Erwin Reichl, Tegernheim, both of Fed. Rep. of Germany

[73] Assignee: Sachsenwerk Aktienqesellschaft, Regensburg, Fed. Rep. of Germany

[21] Appl. No.: 396,753

[22] Filed: Aug. 17, 1989

[30] Foreign Application Priority Data

Aug. 18, 1988 [DE] Fed. Rep. of Germany ....... 3828016

[51] Int. Cl.⁵ .......................... G01R 1/02; H01B 17/00
[52] U.S. Cl. ..................................... 324/126; 324/713; 174/139; 338/325; 323/364
[58] Field of Search ............... 324/126, 705, 706, 713, 324/715; 174/139, 143, 144; 323/364, 367; 361/330; 338/20, 49, 322–325

[56] References Cited

U.S. PATENT DOCUMENTS 3,886,448 5/1975 Drabenko et al. .................. 324/723

FOREIGN PATENT DOCUMENTS

| 0216056 | 7/1986 | European Pat. Off. . | |
|---|---|---|---|
| 2833918 | 2/1980 | Fed. Rep. of Germany . | |
| 3121795 | 12/1982 | Fed. Rep. of Germany | 174/139 |
| 2930672 | 2/1985 | Fed. Rep. of Germany | 324/126 |
| 3329748 | 2/1985 | Fed. Rep. of Germany . | |
| 3610742 | 10/1987 | Fed. Rep. of Germany | 324/126 |
| 3804381 | 12/1988 | Fed. Rep. of Germany | 324/126 |
| 0328938 | 8/1989 | Fed. Rep. of Germany | 324/126 |
| 2037440 | 7/1980 | United Kingdom | 323/364 |

Primary Examiner—Reinhard J. Eisenzopf
Assistant Examiner—Jack B. Harvey
Attorney, Agent, or Firm—Spencer & Frank

[57] ABSTRACT

An insulating member which functions as a voltage divider in a high voltage system. The insulating member includes an insulating body having a head section and a base section. The insulating body is made of plastic containing conductive fillers to reduce the active resistance of the body. A metal fitting is embedded in the head section for connecting the head section with high voltage carrying components and for supporting such components. A further metal fitting is embedded in the base section for mechanically holding the insulating member at a grounded frame portion of a high voltage system. An electrode is disposed in the region of the further metal fitting and extends over a significant portion of the cross-sectional area of the insulating body. An electrical terminal is connected with the electrode and is insulated against grounded components of the high voltage system. The insulating member constitutes a resistor-type voltage divider and placement of the electrode in the insulating body defines the voltage divider ratio.

17 Claims, 3 Drawing Sheets

INSULATING MEMBER, FUNCTIONING AS A VOLTAGE DIVIDER IN A HIGH VOLTAGE SYSTEM

CROSS REFERENCE TO RELATED APPLICATION

This application claims the priority of Application Ser. No. P 38 28 016.7 filed Aug. 18, 1988, in the Federal Republic of Germany, the subject matter of which is incorporated herein by reference.

BACKGROUND OF THE INVENTION

The present invention relates to an insulating member of the type disclosed in German Pat. Application No. P 38 04 381.5, the subject matter of which is incorporated herein by reference.

German Pat. Application No. P 38 04 381.5 discloses an insulating member having a limited electrical conductivity which can function, for example, as a supporting insulator or a plug-in member, and simultaneously perform a voltage divider function for a connected measuring or display arrangement in a high voltage system. The insulating member includes a head portion having a fitting which is connected with and supports high voltage carrying active circuit components. A base portion of the insulating member also includes a metal fitting which serves to mechanically fasten the base to grounded frame portions of the high voltage system. Additionally, this base fitting is insulated against grounded components and is provided with an electrical terminal which is connected with a measuring or display device. When the base end face of the insulating member comes in contact with grounded components, an active resistance path forms between the metal fitting in the head portion and the grounded end face in the base portion, with the base metal fitting serving as tap. Thus, the insulating member forms a resistor-type voltage divider.

SUMMARY OF THE INVENTION

It is an object of the present invention to take measures in connection with an insulating member of the above described type so that a defined voltage dividing ratio is realized.

The above and other objects are accomplished in accordance with the invention by the provision of an insulating member which functions as a voltage divider in a high voltage system which measures high voltages and includes high voltage carrying components and electrically grounded components including a grounded frame portion. The insulating member includes an insulating body made of plastic, having a head section and a base section, and containing conductive fillers to reduce the active resistance of the body. A metal fitting is embedded in the head section for connecting the head section with the high voltage carrying components and for supporting such components. A further metal fitting is embedded in the base section for mechanically holding the insulating member at the grounded frame portion of the high voltage system. An electrode is disposed in the region of the further metal fitting and extends over a significant portion of the cross-sectional area of the insulating body. An electrical terminal is connected with the electrode and is insulated against grounded components of the high voltage system. The insulating member constitutes a resistor-type voltage divider and the electrode and electrical terminal constitute a voltage-divider tap, the placement of the electrode defining the voltage-divider ratio.

In one embodiment of the insulating member according to the invention, the inserted electrode permits the voltage dividing ratio to be set to a desired value by changing the distance between the base end face and the location where the electrode is embedded. The geometry and arrangement of the base fitting can then be dimensioned primarily according to mechanical strength requirements.

An additional electrode is provided in the region of the base end face and, if required, also in the region of the head end face of the insulating body. At the end faces, this additional electrode may be configured as a metallization or an embedded grid. The additional electrode at the head is connected with the adjacent metal fitting and the additional electrode at the base is connected with ground potential. In this way, the total cross section of the insulating body, which is conditionally electrically conductive, is included in the circuit in a defined manner. These measures make ineffective a possible loosening of the embedment material from the fittings when the insulating member is under high mechanical stress. In particular, the arrangement of the electrode acting as the voltage divider tap permits the voltage divider ratio to be set so that given safety or test voltages are not exceeded even in a no-load case, i.e. without a connected external load at the associated electrical terminal. Moreover, with the electrode included in the insulating body there is the additional advantage that the voltage divider has a constant flow resistance and thus it is possible to monitor the operability of the voltage divider by means of external measuring devices. Due to the defined voltage dividing ratio, a short-circuit or a break in the wiring in the measuring system can also be properly detected Preferably, the electrode acting as a voltage divider tap is connected with the base fitting which itself is insulated against electrically grounded components and is connected with an electrical terminal. A screw with which the supporting element is fixed to frame portions of the system may be used as an electrical terminal if the screw is electrically insulated against the frame components. Preferably, the base fitting is set back into the insulating body relative to the base end face of the insulating member so that a resistance path is formed between this end face and the metal fitting. However, it is also possible to have the base fitting terminate flush with the base end face and to provide the electrode forming the voltage divider tap with an independent electrical terminal without directly electrically connecting the metal fitting with the electrode. The base fitting may then be in direct contact with the respective frame portions and may be screwed to them.

Additionally, adjacent to the base end face and also adjacent to the head end face, an additional electrode may be provided of which the additional electrode at the head may be connected with the adjacent metal fitting and the additional electrode at the base may be connected with grounded components. In that case it is advisable to give the additional electrode at the base its own associated electrical connecting member. The additional base electrode may then be grounded in the vicinity of or at the input of the connected measuring or display arrangement so that the voltage detection system still furnishes correct measured values even if a difference voltage develops relative to the ground potential of the measuring or display device. Such a difference voltage could develop as a result of an increase in ground potential at the location where the supporting member is installed, for example due to a ground fault or to a sparkover caused by a current surge at or in the vicinity of such location. To avoid falsification of the measuring result, the base end face is insulated against grounded frame portions. Moreover, the additional electrode at the base also creates defined conditions for the ground potential which, even if the base end face is metallized by means of protective lacquers, adhesives or corrosion, may take on undefined values. Voltage differences between the grounding location of the measuring and display device and the location where the insulating member is fastened then have no effect.

To evaluate the voltage across the voltage divider, a series connection of a resistor, a capacitor and a further, unilaterally grounded resistor can be employed at the electrical terminal of the electrode as part of a measuring and/or display arrangement. A normally closed contact is connected in parallel with the capacitor and the series connection of a normally open contact and an electrical measuring and/or display device is connected in parallel with the unilaterally grounded resistor. The two switches then have a common associated actuating element. If the contacts are not actuated, the measuring or display device has no load and may therefore be equipped with an LCD (liquid crystal display) element. The service life of an LCD is shorter than the service life of the switching system if operated continuously, but if turned on only sporadically, attains a very long service life. Additionally, this also protects the measuring or display device against excess voltages. Moreover, the inserted capacitor prevents any direct voltages from reaching the measuring or display device during the measuring process. Additionally, by way of the series connection, monitoring and voltage or resistance measurements can be taken at the base resistance of the voltage divider or in its measuring circuitry, respectively, by way of measuring sockets connected to the series connection and simple measuring devices, with the important monitoring of all connecting lines between the insulating member and the measuring and display device being performed simultaneously.

BRIEF DESCRIPTION OF THE DRAWINGS

Specific embodiments of the invention will now be described in greater detail with reference to the drawings, wherein.

DESCRIPTION OF THE PREFERRED EMBODIMENTS

Figure 1:
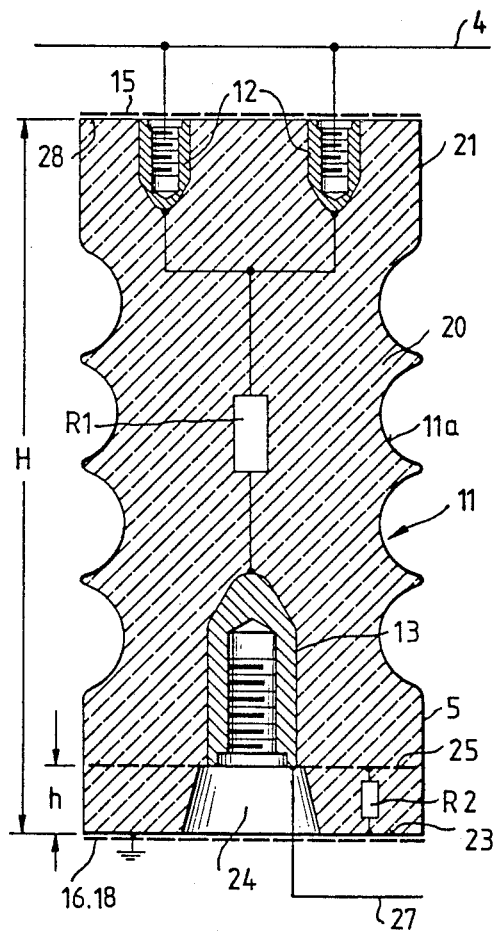
FIG. 1 is a cross-sectional diagram and schematic which shows an insulating member in the form of a supporting insulator having limited electrical conductivity and an embedded electrode.

Referring to FIG. 1, there is shown a supporting insulator 11 which includes an insulating body 20 made of plastic and having limited electrical conductivity produced by electrically conductive additives in the plastic. Insulating body 20 has an essentially cylindrical shape, with corrugated exterior walls 11a. Insulating body 20 is provided with head fittings 12 which are electrically and mechanically connected with a bus bar 4 to which a high voltage is applied. Insulating body 20 has a base 5 in which there is centrally provided a base fitting 13 with the aid of which supporting insulator 11 and its corresponding end face 23 can be tightened by way of a screw 22 (shown in FIG. 3) against a grounded base face and against frame portions 17 (also shown in FIG. 3) of a high voltage system so as to give it mechanical support. End face 23 is provided with a recess 24 from the bottom of which base fitting 13 extends into insulating body 20.

Within the cross-sectional area of insulating body 20 in the region of base 5, there is provided an electrode 25 which is integrated in insulating body 20 and may be configured as a grid so as to extend over essentially all of the cross section of insulating body 20. Preferably, electrode 25 extends parallel to end face 23 and lies at the height of the lower end of adjacent base fitting 13 as shown in FIG. 1. The electrical conductivity of insulating body 20 is set very low by means of conductive additives in the insulating material as disclosed in German Pat. Application No. P 38 04 381.5. Thus, supporting insulator 11 acts as an insulating member and also constitutes a defined active resistance in which a partial resistance R1 is formed between metal fittings 12 and base fitting 13 and another partial resistance R2 is formed between base fitting 13 and adjacent end face 23 which is contacted either by means of a metallization 18, a metal plate 16 or by frame portion 17. The resistance ratio of resistors R1 and R2 here determines the voltage dividing ratio and thus the voltage across resistor R2 during operation. Electrode 25 is electrically conductively connected with base fitting 13. By its defined geometric position, at a distance h from end face 23, electrode 25 creates a correspondingly defined dividing ratio for the electrical resistance values.

Since recess 24 causes base fitting 13 to be set back relative to end face 23, resistor R2 is not electrically bridged by base fitting 13.

Figure 3:
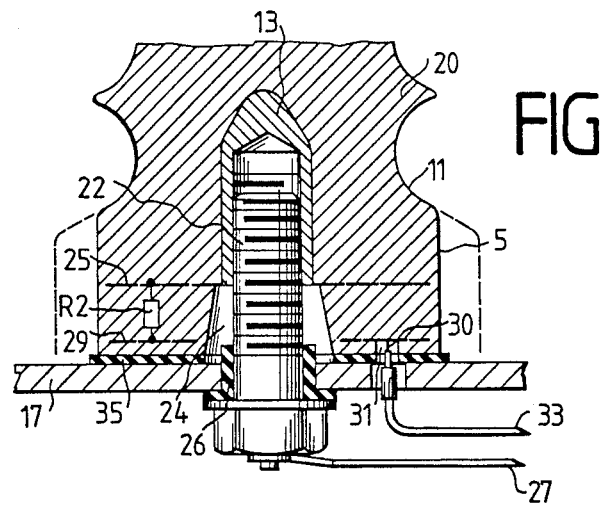
FIG. 3 is a partial cross-sectional diagram which shows a base section of the supporting insulator connected to a frame section.

With electrode 25 electrically connected with metallic base fitting 13, this metal fitting can be utilized as an electrical terminal to tap the voltage present across resistor R2. It is then necessary to electrically insulate screw 22 by means of an insulating sleeve 26 relative to the grounded frame portions 17 as shown in FIG. 3. Additionally, screw 22 may be connected with an electrical terminal 27, unless base fitting 13 is equipped with its own electrical terminal.

Figure 2A:
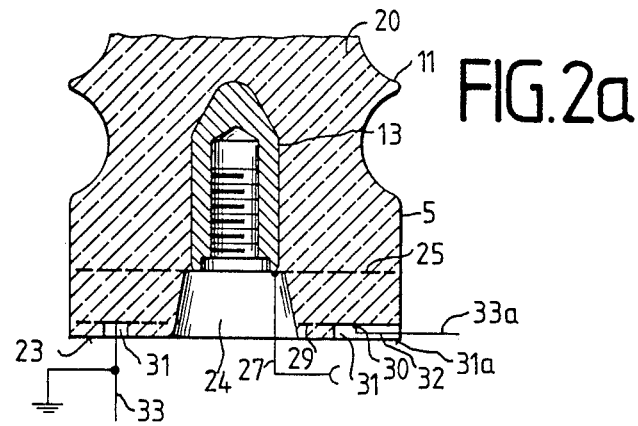
FIG. 2a is a partial cross-sectional diagram and schematic which shows the base section of the supporting insulator, supplemented by an additional electrode.
Figure 2B:
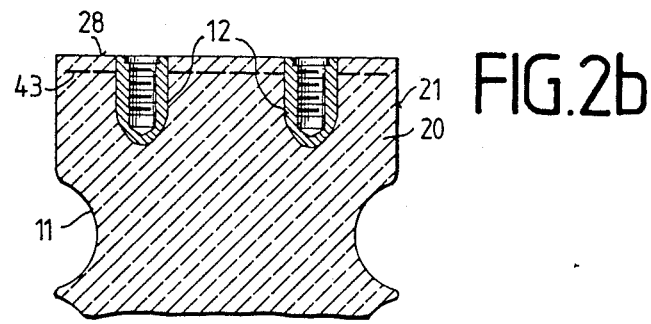
FIG. 2b is a partial cross-sectional diagram which shows the head section of the supporting insulator, supplemented by an additional electrode.
Figure 2C:
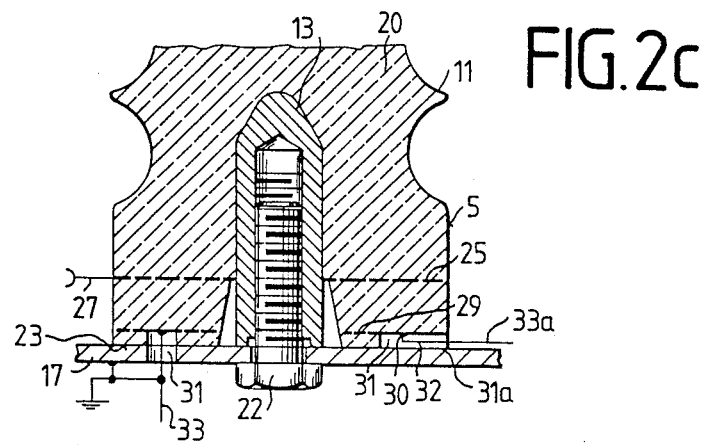
FIG. 2c is a partial cross-sectional diagram, which shows the base section of the supporting insulator, where the base fitting is electrically grounded.

According to one variation shown in FIG. 2c, it is not necessary to connect electrode 25 directly with base fitting 13 in which case it will have its own separate electrical terminal and base fitting 13 may be grounded. Moreover, in this variation, base fitting 13 may be pulled forward into the plane of frontal face 23 so that the mechanical tension generated by screw 22 need not be absorbed by insulating body 20. The partial voltage present across resistor R2 is then obtained only at electrode 25 which is embedded in insulating body 20.

Additionally, according to a further variation as shown in FIGS. 2a and 2b, near base end face 23 and possibly also in parallel with head end face 28 of insulating body 20, additional electrodes 29 and 43, respectively, may be provided in insulating body 20 so as to extend parallel to the respective end faces and possibly replace metal plates 15 and 16 or metallization 18 associated with end faces 23 and 28. Additional electrodes 29 and 43, respectively, cause resistance R1 to be reduced while simultaneously the current is distributed over the entire cross section of insulating body 20, with additional electrode 43 at the head possibly being connected with head fittings 12 and additional electrode 29 at the base with grounded components. For this purpose, additional base electrode 29 is provided with its own electrical terminal 30 which is accessible only through a recess 31 in base 5 open toward frontal face 23 (FIG. 3). It is also possible for an outwardly oriented channel 31a to emanate from recess 31, with a connecting line 33a being guided therein as shown in FIG. 2a. Additional electrode 29 is here disposed spatially between electrode 25 and end face 23. Resistor R2 at which the measuring voltage is obtained is then formed between electrodes 25 and 29. If the additional base electrode 29 is not grounded directly in the region of supporting insulator 11 but is brought to a measuring and/or display arrangement 34 (FIG. 4) remote therefrom, an insulating layer 35 (FIG. 3) is advisably inserted between end face 23 and grounded frame portions 17. Insulating layer 35 avoids measurement or display of any possible increases in potential at the frame components in the case of a ground fault.

Figure 4:
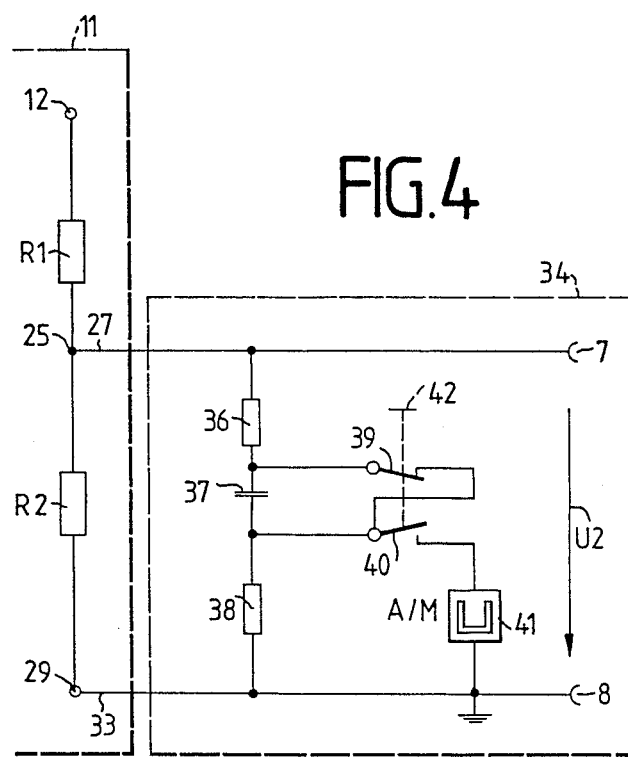
FIG. 4 is a circuit schematic which shows a measuring and display arrangement in connection with the supporting insulator.

Referring to FIG. 4, measuring and display device 34 has terminals 27 and 33 connected across resistor R2. The latter has associated test terminals 7 and 8, respectively, for the connection of external measuring devices. Within measuring and display device 34, a series connection of a resistor 36, a capacitor 37 and a further, unilaterally grounded resistor 38 is connected to electrical terminal 27 of electrode 25, with the grounded line here being identical with connecting line 33 of additional electrode 29. A normally closed contact 39 lies in parallel with capacitor 37 and a series connection of a normally open contact 40 with an electrical measuring and/or display device 41 in the form of an LCD instrument lies in parallel with capacitor 37. Contacts 39 and 40 have a common associated actuating element 42.

If a high voltage is present at bus bar 4 and thus at head fittings 12, then this voltage is divided toward ground in correspondence with the resistance ratio of resistors R1 and R2. After actuating element 42 has been switched, so that normally closed contact 39 is open and normally open contact 40 is closed, the measuring voltage applied to resistor R2 is displayed in device 41. However, capacitor 37 included in the measuring circuit detects only alternating voltages. Possibly occurring direct voltages charge capacitor 37 without causing current to flow through measuring and/or display device 41.

Otherwise, in order to prevent undue build-up of direct voltages, capacitor 37 is short-circuited at terminal 27. The display of device 41 can be monitored at test terminals 7 and 8 by means of external measuring devices. The voltage across resistor R2 can be measured if actuation key 42 is depressed or the entire circuit can be checked for a break in a wire by the same action.

Obviously, numerous and additional modifications and variations of the present invention are possible in light of the above teachings. It is therefore to be understood that within the scope of the appended claims, the invention may be practiced otherwise than as specifically claimed.

What is claimed is:

1. An insulating member which functions as a voltage divider for use in a high voltage system which measures high voltages and includes high voltage carrying components and electrically grounded components including a grounded frame portion, said insulating member comprising:
    an insulating body made of plastic, having a head section and a base section, and containing conductive fillers to reduce the active resistance of said body;
    a head fitting made of metal and embedded in said head section for connecting said head section with high voltage carrying components of a high voltage system and adapted for supporting such components;
    a base fitting made of metal and embedded in said base section, said base fitting including means for mechanically holding said insulating member at a grounded frame portion of a high voltage system;
    an electrode disposed in the region of said base fitting and extending over a significant portion of the cross-sectional area of said insulating body; and
    an electrical terminal connected with said electrode, said insulating member including means for insulating said electrical terminal with respect to grounded components of a high voltage system;
    wherein said insulating member constitutes a resistor-type voltage divider and said electrode and electrical terminal constitute a voltage divider tap, the placement of said electrode defining the voltage divider ratio.

2. An insulating member as defined in claim 1, wherein said electrode is electrically connected with said base fitting and said base fitting is electrically connected with said electrical terminal; and further including means for electrically insulating said base fitting from grounded components.

3. An insulating member as defined in claim 1, wherein said base section has an end face disposed for facing a grounded frame portion of a high voltage system, and a recess is provided in said end face, said base fitting being set back in the recess relative to said end face.

4. An insulating member as defined in claim 1, wherein said electrode comprises a grid which is embedded in said insulating body.

5. An insulating member as defined in claim 1, wherein said base section has an end face disposed for facing a grounded frame portion of a high voltage system and said electrode extends parallel to said end face.

6. An insulating member as defined in claim 1, wherein said base fitting is electrically grounded and said electrode is electrically insulated therefrom and is electrically connected with said terminal.

7. An insulating member as defined in claim 1, wherein said base section has an end face disposed for facing a grounded frame portion of a high voltage system; and further including a second electrode embedded in said insulating body between said electrode and said end face; and a second terminal electrically connected to said second electrode.

8. An insulating member as defined in claim 7, and further comprising an electrical insulating layer disposed at said end face for insulating said end face with respect to a grounded frame portion of a high voltage system.

9. An insulating member as defined in claim 7, wherein said end face has a recess and said second terminal is disposed in said recess.

10. An insulating member as defined in claim 9, wherein said insulating body has an exterior side face, and further including a channel in said insulating body connecting said recess to said exterior side face.

11. An insulating member as defined in claim 1 forming a combination with a measuring arrangement including: a resistor, a capacitor and a unilaterally grounded resistor connected to form a first electrical series connection which is connected to said electrical terminal; a normally closed contact connected in electrical parallel with said capacitor; a normally open contact and an electrical measuring device forming a second electrical series connection which is connected in electrical parallel with said unilaterally grounded resistor; and a common actuating element connected to both said normally closed contact and said normally open contact for simultaneously actuating said contacts.

12. A combination as defined in claim 11, wherein said base section has an end face disposed for facing a grounded frame portion of a high voltage system; and further including a second electrode embedded in said insulating body between said electrode and said end face; and a second terminal electrically connected to said second electrode.

13. A combination as defined in claim 12, wherein said measuring arrangement includes a grounded connecting line and said second electrode is electrically connected with said grounded connecting line.

14. A combination as defined in claim 11, and further comprising test terminals connected to opposite ends of said first series connection.

15. An insulating member as defined in claim 1, wherein said head section has a head end face, and further comprising an additional electrode disposed in said insulating body parallel with said head end face.

16. An insulating member as defined in claim 1, wherein said head section has a head end face and said base section has a base end face, and further including a metal plate disposed on at least one of said end faces.

17. An insulating member as defined in claim 1, wherein said head section has a head end face and said base section has a base end face, and further including a metallization provided on at least one of said end faces.

* * * * *